United States Patent
Yang

(10) Patent No.: US 7,999,297 B2
(45) Date of Patent: Aug. 16, 2011

(54) SEMICONDUCTOR DEVICE HAVING STACKED DECOUPLING CAPACITORS

(75) Inventor: Hyang-Ja Yang, Suwon-si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 1285 days.

(21) Appl. No.: 11/370,365

(22) Filed: Mar. 8, 2006

(65) Prior Publication Data

US 2006/0208299 A1 Sep. 21, 2006

(30) Foreign Application Priority Data

Mar. 21, 2005 (KR) .................. 10-2005-0023228

(51) Int. Cl.
  *H01L 27/108* (2006.01)
(52) U.S. Cl. ........ 257/300; 257/298; 257/303; 257/306; 257/307; 257/532
(58) Field of Classification Search .................. 257/532, 257/306, 307, 298, 300, 303
  See application file for complete search history.

(56) References Cited

U.S. PATENT DOCUMENTS

| | | |
|---|---|---|
| 5,675,185 A | 10/1997 | Chen et al. |
| 5,739,576 A | 4/1998 | Shirley et al. |
| 5,851,868 A | 12/1998 | Kim |
| 6,054,359 A | 4/2000 | Tsui et al. |
| 6,124,163 A | 9/2000 | Shirley et al. |
| 6,475,838 B1 | 11/2002 | Bryant et al. |
| 6,608,365 B1 | 8/2003 | Li et al. |
| 6,667,518 B2 | 12/2003 | Christensen et al. |

OTHER PUBLICATIONS

European Search Report - EP-07-01-3186; Date of Search Oct. 31, 2007.

*Primary Examiner* — Samuel A Gebremariam
(74) *Attorney, Agent, or Firm* — F. Chau & Associates, LLC

(57) ABSTRACT

A semiconductor device having transistors formed on different layers of a stack structure includes a stacked capacitor cluster, wherein a stacked capacitor of the stacked capacitor cluster includes an insulation layer of a transistor of the semiconductor device, and at least a first conduction layer and a second conduction layer disposed above and below the insulation layer, wherein the stacked capacitor is a decoupling capacitor of the stacked capacitor cluster connected in parallel between a first line and a second line.

5 Claims, 5 Drawing Sheets

SEMICONDUCTOR DEVICE HAVING STACKED DECOUPLING CAPACITORS

This application claims priority to Korean Patent Application No. 10-2005-0023228, filed on Mar. 21, 2005, in the Korean Intellectual Property Office, which is herein incorporated by reference.

BACKGROUND OF THE INVENTION

1. Technical Field

The present invention relates to a semiconductor integrated circuit, and more particularly, to a semiconductor device having stacked decoupling capacitors.

2. Discussion of Related Art

Semiconductor memory devices such as an SRAM (Static Random Access Memory) have been developed for high speed and high integration applications in electronic systems such as personal computers and communication appliances. To this end, manufacturers of semiconductor memory devices have sought to dispose memory cells within a memory cell region to reduce a critical dimension, increase efficiencies of manufacturing processes, etc. Such an architecture has resulted in layouts having peripheral circuits adjacent to the memory cell region.

For example, decoupling capacitors disposed on a peripheral circuit region within a chip filter noises between operating supplies, e.g., power and ground. Decoupling capacitors disposed on the peripheral circuit region need to provide a large capacitance in a limited area.

An example of a decoupling capacitor is a MOS (Metal Oxide Semiconductor) type capacitor. A gate oxide layer of the MOS transistor is used as a dielectric layer, an impurity diffused region formed on a silicon substrate is used as a first electrode, and a gate layer formed of polysilicon can be used as a second electrode on the gate oxide layer.

A multilayer decoupling capacitor structure in a semiconductor memory device, such as a DRAM (Dynamic Random Access Memory), is shown in FIG. 1.

Referring to FIG. 1 illustrating a sectional structure of multilayer decoupling capacitor, a substrate layer and first, second and third polysilicon layers are used as an electrode of capacitor, to form the multilayer decoupling capacitor. A first polysilicon electrode can be fabricated together with a gate electrode of a cell transistor formed within a memory cell region through a deposition process. Second polysilicon electrodes 62, 64, 72 and 74, and third polysilicon electrodes 60 and 70, are formed within the peripheral circuit region, through a separate process from the fabrication process performed in a memory ell region. The second polysilicon electrodes 62, 64, 72 and 74, and the third polysilicon electrodes 60 and 70, are formed through a separate deposition process in which the memory cell region is masked. For the second polysilicon electrodes 62, 64, 72 and 74, a flow process to contact with n+ regions 76, 78 and 82 is needed. The separate deposition process causes a cost increase.

FIG. 2 illustrates a layout of MOS capacitors that have been fabricated together with MOS transistors. A gate polysilicon region 4 is formed on an active region 2. The active region 2 is a region doped with n+ or p+ type impurity, and forms a first electrode. The gate polysilicon region 4 is a region doped with p+ or n+ type impurity, and forms a second electrode. A dielectric layer of the capacitor becomes a gate oxide layer interposed between a substrate on which the active region 2 and the gate polysilicon region 4 are formed. Where a decoupling capacitor of the MOS type is used to remove power noise, the gate polysilicon region 4 is electrically connected with a metal line 6 through a contact CN1, and the active region 2 is connected with metal lines 9, 10, and 8 through a contact CN2. The metal line 6 is a power line for transferring an operating power source voltage VDD, and the metal line 8 is a ground line for transferring a ground voltage GND to remove power noise and obtain reliable power.

A decoupling capacitor of FIG. 2 is fabricated within the peripheral circuit region through the same process as a transistor of a cell region. The decoupling capacitor is a single capacitor disposed planarly. A decoupling capacitance of the decoupling capacitor of FIG. 2 is less than the decoupling capacitor of FIG. 1, and a decoupling loss can result from a short between the first and second electrodes. The MOS-type decoupling capacitor of FIG. 2 has a low capacitance in a highly-integrated semiconductor device.

A manufacturing process technology for stack type semiconductor memory devices has been developed in conformity with the need for high integration, being changed from a planar layout structure of memory cell transistors of the memory cell region, e.g., in an SRAM. A stack type semiconductor device is fabricated comprising a single stacked memory cell, four N-type MOS transistors as pull-down and pass transistors formed on a semiconductor substrate layer among six MOS transistors constituting a memory cell, and two P-type MOS transistors as load transistors formed on another substrate layer, e.g., channel silicon layer which is insulatively formed on gate electrodes of the N-type MOS transistors.

A semiconductor memory having stacked memory cells achieves high speed and low power, thus the need for removal of various kinds of signal noises and power noises is increased. Therefore, a need exists for a decoupling capacitor having improved capacitance in a limited area.

SUMMARY OF THE INVENTION

According to an embodiment of the present invention, a semiconductor device having a plurality of transistors formed on different layers comprises a stacked capacitor cluster, wherein a stacked capacitor of the stacked capacitor cluster comprises an insulation layer of a respective one of the plurality of transistors and a first conduction layer and a second conduction layer disposed above and below the insulation layer, respectively, wherein the stacked capacitor is a decoupling capacitor of the stacked capacitor cluster connected in parallel between a first line and a second line.

One capacitor cluster of the stack type can include at least three decoupling capacitors. The first line may be a power source voltage line, and the second line may be a ground voltage line. The first line may be a signal line, and the second line may be a ground voltage line.

For a semiconductor device comprising three decoupling capacitors, a first decoupling capacitor comprises a gate oxide layer of MOS transistor as a first dielectric layer, a second decoupling capacitor comprises a first top gate insulation layer formed on a first channel silicon layer, as a second dielectric layer, the first channel silicon layer being positioned on the MOS transistor, and a third decoupling capacitor comprises a second top gate insulation layer formed on a second channel silicon layer, as a third dielectric layer, the second channel silicon layer being positioned on the first top gate insulation layer.

For a semiconductor device comprising five decoupling capacitors, a first decoupling capacitor comprises a gate oxide layer of MOS transistor as a first dielectric layer, a second decoupling capacitor comprises an interlayer insulation layer formed on a gate electrode of the MOS transistor, as a second dielectric layer, a third decoupling capacitor comprises a first top gate insulation layer formed on a first channel silicon layer, as a third dielectric layer, the first channel silicon layer being positioned on the interlayer insulation layer, a fourth decoupling capacitor comprises an interlayer insulation layer formed on a first top gate, as a fourth dielectric layer, the first top gate being formed on the first top gate insulation layer, and a fifth decoupling capacitor comprises a second top gate insulation layer formed on a second channel silicon layer, as a fifth dielectric layer, the second channel silicon layer being positioned on the fourth dielectric layer.

BRIEF DESCRIPTION OF THE DRAWINGS

Embodiments of the present invention will become more fully understood from the detailed description given herein below and the accompanying drawings which are given by way of illustration only, and thus are not limiting, wherein.

DETAILED DESCRIPTION OF PREFERRED EMBODIMENTS

Figure 1:
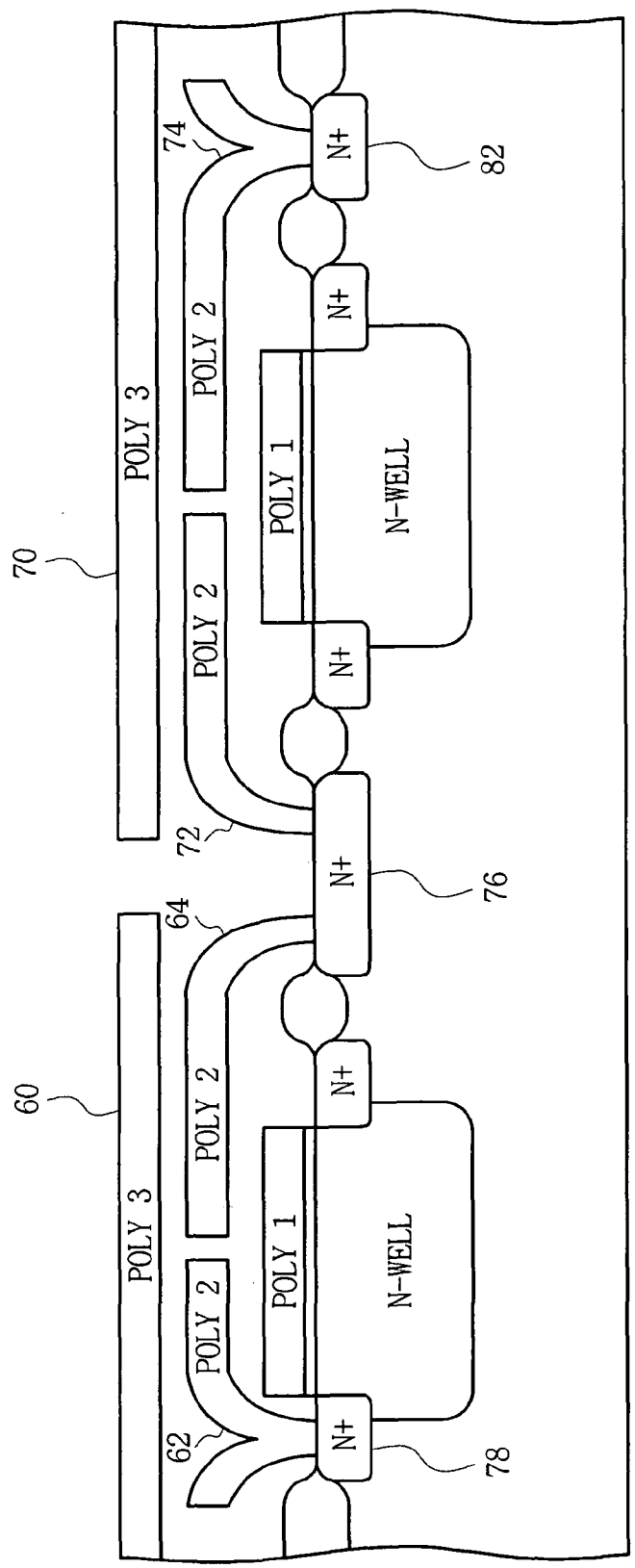
FIG. 1 illustrates a sectional structure of multilayer decoupling capacitor according to a prior art.
Figure 2:
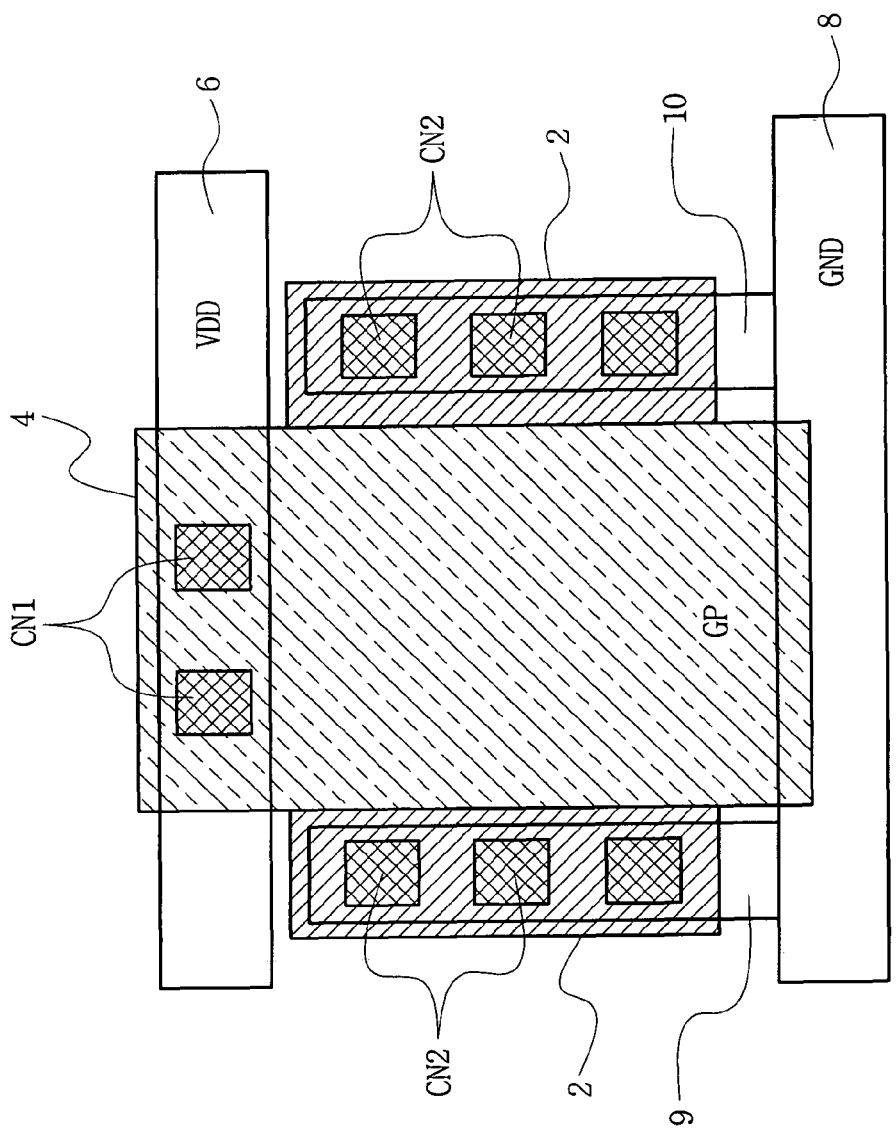
FIG. 2 illustrates a layout of MOS capacitors according to a prior art.

Hereinafter, exemplary embodiments of the present invention will be described in detail with reference to FIGS. 3 to 5 in which like reference characters refer to the same parts throughout the different views. It will be understood by those skilled in the art that embodiments may be modified and are not limited to the following description.

In applying a design rule under about 80 nm, six transistors constituting a full CMOS SRAM cell can be disposed on different layers. For SRAM cells having a reduced cell pitch adjacent to a resolution limited neighborhood of a photolithography process, a size of decoupling capacitors disposed on a peripheral circuit region should be reduced according to the reduction in cell pitch. When the size of decoupling capacitor is reduced, a capacitance value is also reduced, thus a technique for reducing only the size of the decoupling capacitor without substantially reducing a capacitance value is needed.

Figure 3:
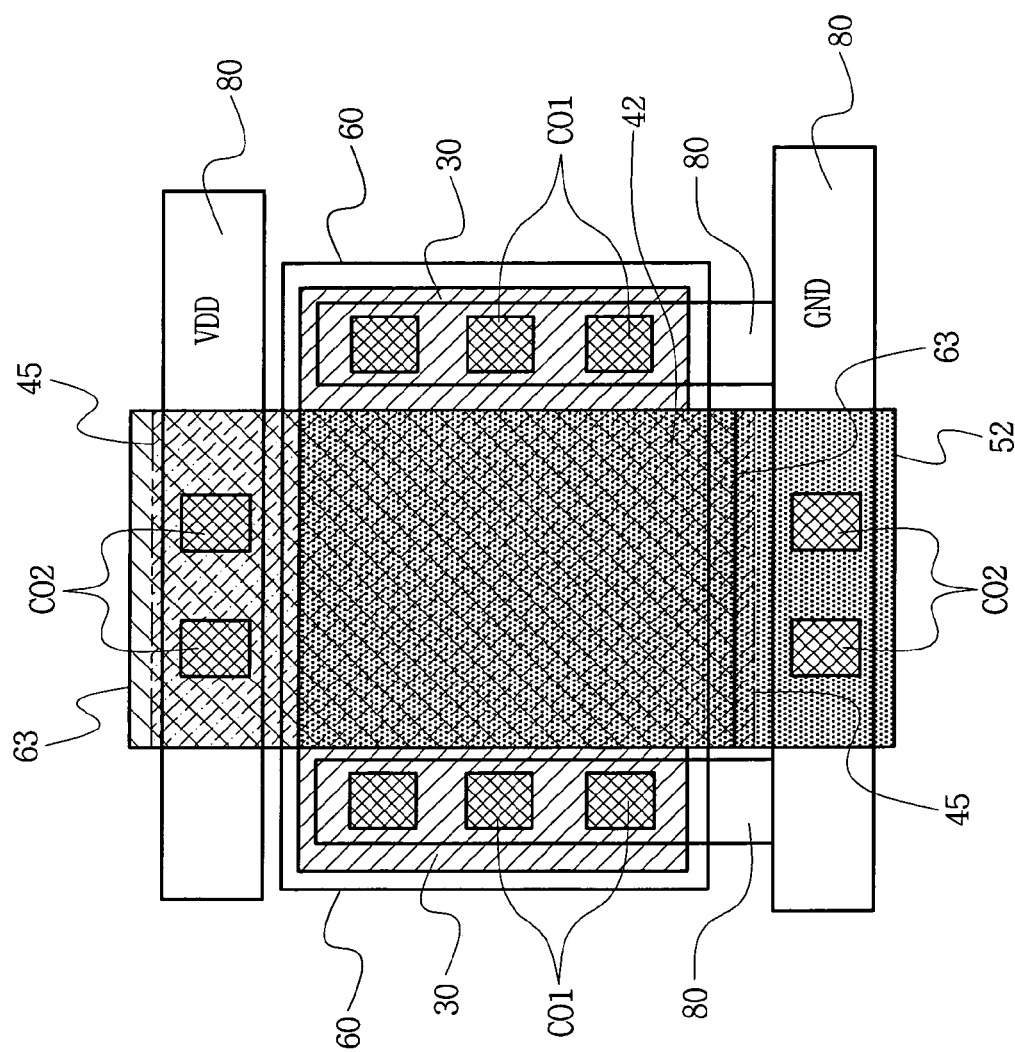
FIG. 3 illustrates a layout of stacked decoupling capacitors according to an exemplary embodiment of the present invention.
Figure 4:
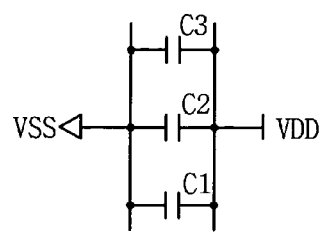
FIG. 4 depicts a sectional structure of stacked decoupling capacitors shown in FIG. 3.
Figure 4:
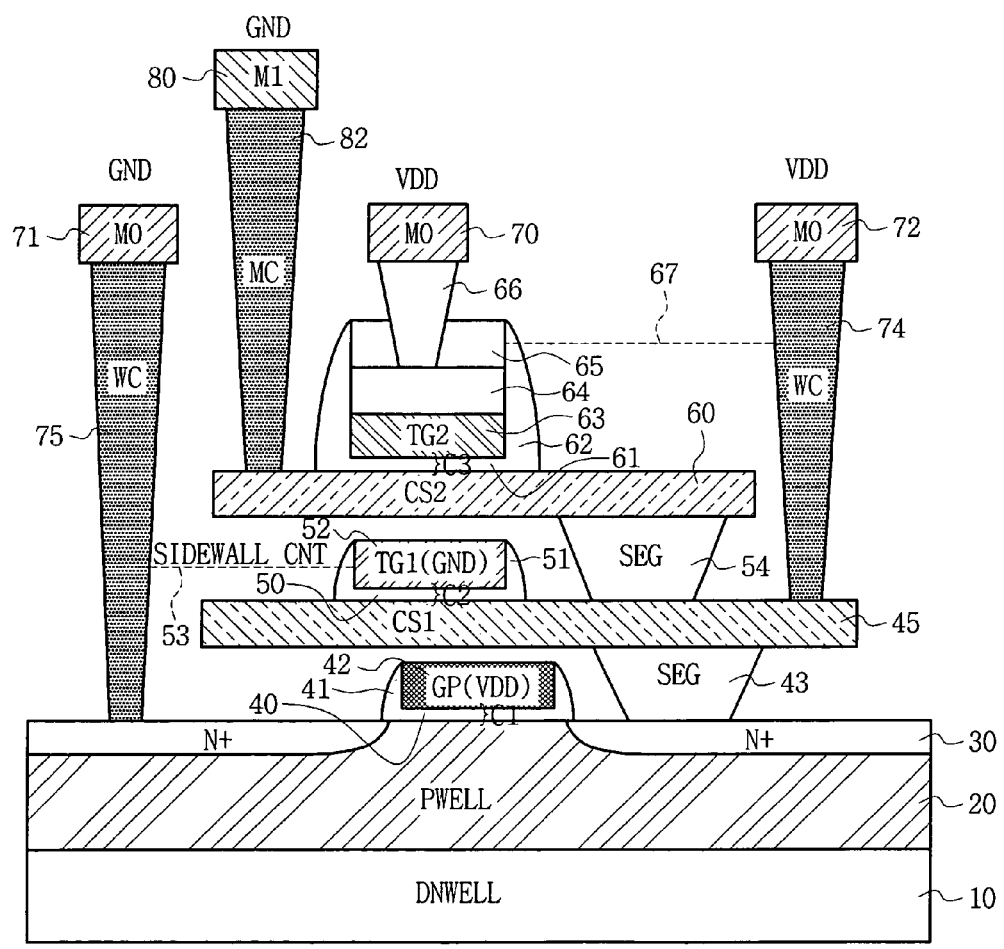

According to an exemplary embodiment of the invention, an exemplary structure of decoupling capacitor having a double stack type is shown in FIGS. 3 and 4.

FIG. 3 illustrates a layout of stack-type decoupling capacitors according to an exemplary embodiment of the present invention. FIG. 4 illustrates a sectional structure of stack-type decoupling capacitors shown in FIG. 3.

Referring to FIGS. 3 and 4, a gate polysilicon layer 42 is formed on an active region 30. A first channel silicon layer 45, a second channel silicon layer 60 and a first metal layer 80 are formed sequentially thereof.

In a semiconductor memory having a memory cell of a double stack type, the first channel silicon layer 45 and the second channel silicon layer 60 are used as a transistor substrate. In the double stacked memory cell, the gate polysilicon layer 42 can be used for the formation of a gate electrode of a pull-down transistor, and a first top gate layer 52 formed on the first channel silicon layer 45 can be used for the formation of a gate electrode of load transistor. A second top gate layer 63 formed on the second channel silicon layer 60 can be formed for the formation of a gate electrode of pass transistor.

In the double stack type memory cell, transistors constituting a memory cell are disposed on three layers, thus a planar size is reduced about two to three times or more. A conductive layer formed on a memory cell region and peripheral circuit region is pattered functions as a substrate or gate electrode on the memory cell region, and functions as an electrode of decoupling capacitor on the peripheral circuit region. According to an exemplary embodiment of the invention, first and second channel silicon layers 45 and 60 and first and second top gate layers 52 and 63 of the double stack type memory cell are utilized as electrodes of decoupling capacitors.

A capacitor cluster of the double stack type memory cell shown in FIGS. 3 and 4 comprises insulation layers 40, 50 and 61 and conduction layers 30, 42, 45, 51, 60 and 63. The double stack type memory cell comprises decoupling capacitors C1, C2 and C3. The insulation layers 40, 50 and 61, the conduction layers 30, 42, 45, 51, 60 and 63 positioned on upper and lower layers from the boundary of the insulation layers, and the decoupling capacitors C1, C2 and C3 are respectively connected in parallel between first and second lines VDD and GND. The double stack type memory cell further includes a metal silicide layer 64, formed by a reaction to refractory metal material such as tungsten to reduce a resistance, a hard mask layer 65 and a tungsten contact 66.

Though only one capacitor cluster is shown in the drawings for a convenience, a plurality of capacitor clusters are provided in a peripheral circuit region of chip, being connected with power lines and various reference signals. The power source voltage (VDD) line and the ground voltage (GND) line can be used for other signals, wherein for example, the first line can be a signal line to transfer various signals of a semiconductor device, and the second line can be a ground voltage line.

A cluster is a group of two or more capacitors connected with each other, e.g., in parallel or in series.

As shown in the drawings, when one capacitor cluster has three decoupling capacitors, a first decoupling capacitor C1 shown in FIG. 4 is formed by using a gate oxide layer 40 of MOS transistor as a first dielectric layer. A second decoupling capacitor C2 is formed by using a first top gate insulation layer 50 formed on a first channel silicon layer 45 as a second dielectric layer, the first channel silicon layer 45 being positioned on the MOS transistor. A third decoupling capacitor C3 is formed by using a second top gate insulation layer 61 formed on a second channel silicon layer 60 as a third dielectric layer, the second channel silicon layer 60 being positioned on the first top gate insulation layer 50.

In the drawings, a first electrode (bottom electrode in the drawing) of first decoupling capacitor C1 is an active region 30 doped with n+ type impurity, and a second electrode (top electrode in the drawing) is a gate polysilicon layer 42 doped with p+ type impurity. A first electrode (a bottom electrode in the drawing) of second decoupling capacitor C2 is a first channel silicon layer 45, and a second electrode (top electrode in the drawing) is a first top gate 51. A first electrode (bottom electrode in the drawing) of third decoupling capacitor C3 is a second channel silicon layer 60, and a second electrode (top electrode in the drawing) is a second top gate 63.

When decoupling capacitors are used to remove power noise, the ground voltage GND is coupled with the active region 30, the first top gate 51 and the second channel silicon layer 60, and the power source voltage VDD is coupled with the gate polysilicon layer 42, the first channel silicon layer 45 and the second top gate 63.

The first and second top gate insulation layers 50 and 61 can be formed of TEOS, silicon dioxide, silicon nitride layer, or a composite layer of materials selected from these materials. Other materials may be used having a high dielectric constant, as the dielectric material of the capacitor, and are well known to those skilled in the art. The polysilicon layer is doped, and a surface layer of the polysilicon layer can become silicided, e.g., titanium silicide, tungsten silicide. Meanwhile, a sidewall connector (CNT) layer 53 electrically connects the first top gate 51 and a tungsten contact 75.

The active region 30 is connected to a metal zero layer 71 through a tungsten contact WC 75, and the metal zero layer 71 is coupled with the ground voltage GND. The metal zero layer 71 may be a metal damascene layer formed of material such as tungsten. First contacts CO1 shown in FIG. 3 are metal contacts connected with the tungsten contact 75 and the metal zero layer 71. Details for a metal damascene process are widely known in the art, thus a detailed description for the damascene process is omitted.

The first channel silicon layer 45 formed on a selective epitaxial growth (SEG) layer 43 is connected to metal zero layer 72 through tungsten contact WC 74, to function as a bottom electrode of the second decoupling capacitor C2. The metal zero layer 72 is coupled with the power source voltage VDD.

The second channel silicon layer 60 formed on a selective epitaxial growth (SEG) layer 54 is connected to a first metal layer M1, 80 through a metal contact MC 82, to function as a bottom electrode of the third decoupling capacitor C3. The first metal layer 80 can be formed of metal material such as Aluminum, and is connected to the power source voltage. Second contacts CO2 shown in FIG. 3 nest contacts and metal contacts MC. The metal contact MC is connected to the first metal layer M1, 80, and to the nest contacts. The nest contacts are formed in a lower part of the metal contacts, and have a contact plug that electrically connects with an upper part or side part of the second channel silicon layer 60.

FIG. 4 shows a second decoupling capacitor C2 comprising the CS1 layer 45 and TG1 52 as electrode layers, and a third decoupling capacitor C3 comprising the CS2 layer 60 and TG2 63 as electrode layers. The second decoupling capacitor C2 and the third decoupling capacitor C3 are stacked on a first decoupling capacitor C1 comprising an n-type MOS capacitor in a peripheral circuit region or field region. The CS1 layer 45 is biased with VDD, the TG1 layer 52 is biased with GND, the CS2 layer 60 with GND, and the TG2 layer 63 with VDD. The CS1 layer, the TG1 layer, the CS2 layer and the TG2 layer are representative of an equivalent circuit having three capacitors connected with one another in parallel shown in the upper part of FIG. 4.

Thus, in a semiconductor memory employing a double stacked memory cell, three decoupling capacitors connected in parallel can be fabricated together with the fabrication of memory cells without a specific additional process, and a layout area of peripheral circuit region on which the decoupling capacitors are formed is substantially reduced planarly.

Figure 5:
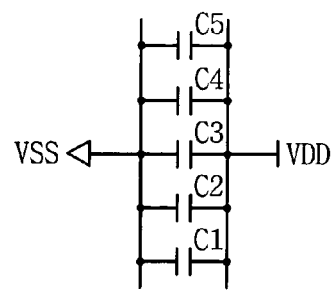
FIG. 5 depicts a sectional structure of stacked decoupling capacitors according to another exemplary embodiment of the present invention.
Figure 5:
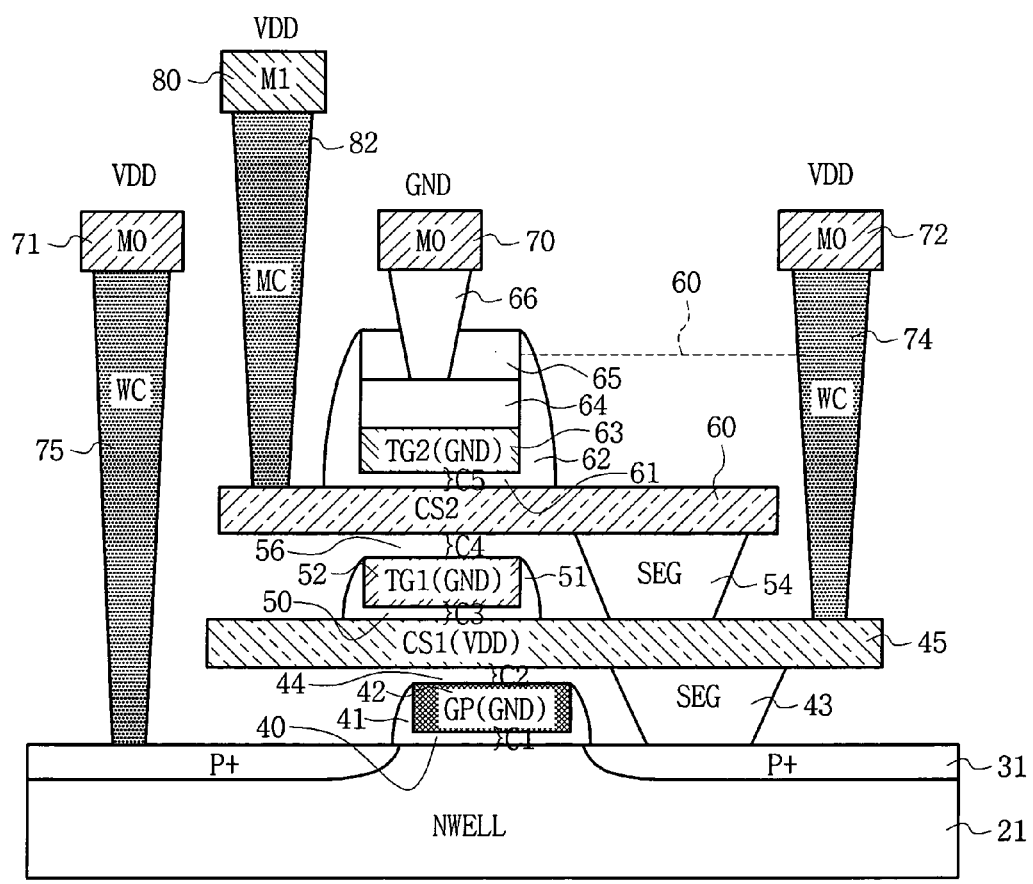

FIG. 5 depicts a sectional structure of stack-type decoupling capacitor according to an exemplary embodiment of the present invention, wherein two decoupling capacitors are added so as to obtain a capacitor cluster having a large capacitance. In FIG. 5, a semiconductor memory also employs a double stacked memory cell, wherein a P-type MOS transistor is formed on a first layer as a MOS layer.

Referring to FIG. 5, five decoupling capacitors C1-C5 form a stack structure connected between the power source voltage VDD and the ground voltage VSS.

The decoupling capacitor C1 of a lowermost layer is constructed of a PMOS capacitor, and the CS1 layer (45) is biased with GND, the TG1 layer (52) is biased with VDD, the CS2 layer (60) is biased with VDD and the TG2 layer (63) is biased with GND.

In FIG. 5, a first decoupling capacitor C1 is formed by using the gate oxide layer 40 of MOS transistor as a first dielectric layer; the second decoupling capacitor C2 is formed by using an interlayer insulation layer 44 formed on the gate electrode 42 of the MOS transistor, as a second dielectric layer; the third decoupling capacitor C3 is formed by using the first top gate insulation layer 50 formed on the first channel silicon layer 45, as a third dielectric layer, the first channel silicon layer 45 being positioned on the interlayer insulation layer 44; a fourth decoupling capacitor C4 is formed by using an interlayer insulation layer 56 formed on the first top gate 52, as a fourth dielectric layer, the first top gate 52 being formed on the first top gate insulation layer; and a fifth decoupling capacitor C5 is formed by using the second top gate insulation layer 61 formed on the second channel silicon layer 60, as a fifth dielectric layer, the second channel silicon layer 60 being positioned on the fourth dielectric layer.

An active region 31 is biased with VDD, the gate polysilicon layer 42 with GND, the CS1 layer 45 with VDD, the TG1 layer 52 with GND, the CS2 layer 60 with VDD, the TG2 63 with a GND.

In FIG. 5, in a memory cell region, load transistors are formed as a first layer, and thereon, a pull-down transistor and a pass transistor are disposed.

A method of forming the structure of FIG. 5 is substantially similar to the case of FIG. 4, except for the type of transistor and the supply of bias.

While the present invention has been particularly shown and described with reference to exemplary embodiments thereof, it will be understood by those skilled in the art that various changes in form and details may be made therein without departing from the spirit and scope thereof. The number of decoupling capacitors implemented may be changed according to a designer's needs. Accordingly, these and other changes and modifications are within the spirit and scope of the present invention.

For example, according to an exemplary embodiment of the invention, an electrode using a second channel silicon is omitted in a single stacked memory cell. Further, contacts coupled with respective electrodes can be changed to various contacts, such as a nest contact.

What is claimed is:

1. A semiconductor memory device having, as a memory cell, a plurality of transistors disposed on different layers, the semiconductor device comprising: a memory cell array having a first and a second transistor as a memory cell, the first and second transistors respectively disposed on a first substrate layer and a second substrate layer formed on the first substrate layer in a memory cell region; and a stacked capacitor cluster, wherein a stacked capacitor of the stacked capacitor cluster comprises a gate insulation layer of a respective one of the first and the second transistor, the gate insulation layer serving as a dielectric layer of the stacked capacitor, and a first conduction layer disposed above the gate insulation layer and a respective one of the first and second substrate layers disposed below the gate insulation layer; wherein the stacked capacitor is a decoupling capacitor of the stacked capacitor cluster electrically connected in parallel between a first and a second line, in a peripheral circuit region separated from the memory cell region.

2. The semiconductor device of claim 1, wherein the stacked capacitor cluster comprises at least two or more decoupling capacitors.

3. The semiconductor device of claim 1, wherein the second line is a ground voltage line and the first line is a power source voltage line.

4. The semiconductor device of claim 1, wherein at least one of the first and second lines is a signal transfer line for transferring a signal needed for operation of the semiconductor memory device.

5. The semiconductor device of claim 1, wherein the memory cell is a single stacked static random access memory cell, and the semiconductor device has a cell structure wherein a pass transistor and a pull down transistor are formed on the first substrate layer, and a load transistor is formed on the second substrate layer.

* * * * *